United States Patent
Lim et al.

(10) Patent No.: US 9,847,268 B2
(45) Date of Patent: Dec. 19, 2017

(54) SEMICONDUCTOR PACKAGE AND MANUFACTURING METHOD THEREOF

(75) Inventors: Shoa Siong Lim, Singapore (SG); Kian Hock Lim, Singapore (SG)

(73) Assignee: ADVANPACK SOLUTIONS PTE. LTD., Kallang (SG)

( * ) Notice: Subject to any disclaimer, the term of this patent is extended or adjusted under 35 U.S.C. 154(b) by 0 days.

(21) Appl. No.: 13/128,252

(22) PCT Filed: Nov. 20, 2009

(86) PCT No.: PCT/SG2009/000439
§ 371 (c)(1),
(2), (4) Date: May 9, 2011

(87) PCT Pub. No.: WO2010/059133
PCT Pub. Date: May 27, 2010

(65) Prior Publication Data
US 2011/0210439 A1    Sep. 1, 2011

Related U.S. Application Data

(60) Provisional application No. 61/116,703, filed on Nov. 21, 2008.

(51) Int. Cl.
*H01L 23/00* (2006.01)
*H01L 23/24* (2006.01)
*H01L 23/40* (2006.01)

(52) U.S. Cl.
CPC ............. *H01L 23/24* (2013.01); *H01L 24/97* (2013.01); *H01L 23/40* (2013.01);
(Continued)

(58) Field of Classification Search
CPC ....... H01L 23/488; H01L 24/02; H01L 24/10; H01L 23/24; H01L 24/97;
(Continued)

(56) References Cited

U.S. PATENT DOCUMENTS 4,803,544 A * 2/1989 Holzschuh et al. .......... 257/667
5,278,446 A * 1/1994 Nagaraj et al. .............. 257/707
(Continued)

FOREIGN PATENT DOCUMENTS

CN         1222253 A      7/1999
CN       101060088 A     10/2007
(Continued)

OTHER PUBLICATIONS

TW Office Action dated Apr. 30, 2013.
(Continued)

*Primary Examiner* — David Zarneke
(74) *Attorney, Agent, or Firm* — McClure, Qualey & Rodack, LLP (57) ABSTRACT

A semiconductor package and a manufacturing method thereof are disclosed. The semiconductor package includes a device carrier and a stiffener structure. The device carrier includes at least one insulating layer and at least conductive layer defining at least one trace layout unit. The stiffener structure is disposed on the device carrier, surrounding the periphery of the at least one trace layout unit. The stiffener structure is disposed away from the periphery of the at least one trace layout unit, forming a cavity with the device carrier. The shape and disposition of the stiffener structure enhance the strength of the semiconductor package, impeding flexure to the semiconductor package.

29 Claims, 8 Drawing Sheets (52) U.S. Cl.
CPC ............. *H01L 2224/73204* (2013.01); *H01L 2224/73253* (2013.01); *H01L 2224/97* (2013.01); *H01L 2924/14* (2013.01); *H01L 2924/181* (2013.01); *H01L 2924/18161* (2013.01)

(58) Field of Classification Search
CPC . H01L 2224/73204; H01L 2224/73253; H01L 2224/97; H01L 2924/14; H01L 2924/181; H01L 2924/18161
USPC ................. 257/738, 667; 438/112, 123, 124
See application file for complete search history.

(56) References Cited

U.S. PATENT DOCUMENTS

| | | | | |
|---|---|---|---|---|
| 5,841,194 | A * | 11/1998 | Tsukamoto | 257/729 |
| 5,889,323 | A * | 3/1999 | Tachibana | 257/704 |
| 5,905,633 | A * | 5/1999 | Shim et al. | 361/704 |
| 5,909,056 | A * | 6/1999 | Mertol | 257/704 |
| 6,008,536 | A * | 12/1999 | Mertol | 257/704 |
| 6,015,722 | A * | 1/2000 | Banks et al. | 438/108 |
| 6,046,077 | A * | 4/2000 | Baba | 438/127 |
| 6,049,094 | A * | 4/2000 | Penry | 257/99 |
| 6,282,096 | B1 * | 8/2001 | Lo et al. | 361/704 |
| 6,288,904 | B1 * | 9/2001 | Houdeau et al. | 361/760 |
| 6,528,876 | B2 * | 3/2003 | Huang | 257/706 |
| 6,576,073 | B2 * | 6/2003 | Hilton et al. | 156/64 |
| 6,822,867 | B2 * | 11/2004 | Hsieh | 361/704 |
| 6,838,752 | B2 * | 1/2005 | Diot | 257/666 |
| 6,861,747 | B2 * | 3/2005 | Miyazaki et al. | 257/718 |
| 6,940,182 | B2 * | 9/2005 | Hilton et al. | 257/787 |
| 6,943,436 | B2 * | 9/2005 | Radu et al. | 257/678 |
| 7,135,358 | B2 * | 11/2006 | Sugino et al. | 438/126 |
| 7,253,508 | B2 * | 8/2007 | Liu et al. | 257/678 |
| 7,294,907 | B2 * | 11/2007 | Minamio et al. | 257/621 |
| 7,399,658 | B2 * | 7/2008 | Shim et al. | 438/106 |
| 7,443,015 | B2 * | 10/2008 | Punzalan et al. | 257/676 |
| 7,456,500 | B2 * | 11/2008 | Kromotis et al. | 257/725 |
| 7,619,304 | B2 * | 11/2009 | Bauer et al. | 257/678 |
| 7,777,312 | B2 * | 8/2010 | Shimanuki | 257/676 |
| 8,008,756 | B2 * | 8/2011 | Tsumura et al. | 257/667 |
| 2002/0041011 | A1 * | 4/2002 | Shibata | 257/667 |
| 2002/0185717 | A1 | 12/2002 | Eghan | |
| 2003/0038381 | A1 * | 2/2003 | Bolken | 257/787 |
| 2003/0173655 | A1 * | 9/2003 | Rissing et al. | 257/667 |
| 2003/0178709 | A1 * | 9/2003 | Andoh | 257/667 |
| 2004/0124515 | A1 | 7/2004 | Tao et al. | |
| 2005/0051876 | A1 * | 3/2005 | Manalac et al. | 257/666 |
| 2005/0101161 | A1 * | 5/2005 | Weiblen et al. | 439/37 |
| 2005/0139848 | A1 | 6/2005 | Yee | |
| 2005/0242447 | A1 * | 11/2005 | Killer et al. | 257/782 |
| 2005/0280124 | A1 * | 12/2005 | Coyle et al. | 257/666 |
| 2007/0040267 | A1 | 2/2007 | Zhao | |
| 2007/0246821 | A1 * | 10/2007 | Lu et al. | 257/701 |
| 2010/0001387 | A1 * | 1/2010 | Kobayashi et al. | 257/679 |
| 2010/0001388 | A1 * | 1/2010 | Kobayashi et al. | 257/679 |
| 2011/0316130 | A1 * | 12/2011 | Su et al. | 257/666 |
| 2013/0154068 | A1 * | 6/2013 | Sanchez et al. | 257/675 |
| 2013/0334674 | A1 * | 12/2013 | Zheng | 257/676 |

FOREIGN PATENT DOCUMENTS

| | | |
|---|---|---|
| CN | 101090077 A | 12/2007 |
| TW | 200411854 A | 7/2004 |
| TW | 200522379 A | 7/2005 |
| WO | 97/48133 A1 | 12/1997 |

OTHER PUBLICATIONS

English Abstract translation of WO9748133 (corresponding document for CN12222253, published Jul. 7, 1999).
International Search Report and Written Opinion dated Apr. 3, 2010.
English abstract translation of CN101060088 (Published Oct. 24, 2007).
TW Office Action dated Apr. 23, 2015 in corresponding Taiwan application (No. 102142444).

* cited by examiner

SEMICONDUCTOR PACKAGE AND MANUFACTURING METHOD THEREOF

CROSS REFERENCE TO RELATED APPLICATION

This application is the 35 U.S.C. §371 national stage of PCT application PCT/SG2009/000439, filed Nov. 21, 2009, claiming priority of U.S. Provisional Patent Application 61/116,703, filed Nov. 21, 2008, herein incorporated by reference in their entirety.

BACKGROUND OF THE INVENTION

Field of the Invention

The invention relates in general to a package, and more particularly to a semiconductor package and a manufacturing method thereof.

Description of the Related Art

In the past, the semiconductor industry has seen integrated circuits (IC) being produced with fewer IC pads and interconnecting structures. This enables the spacing between the leads and interconnecting structures in the IC. However, recently, the IC packages have become more compact and require increased functions to be incorporated into a semiconductor chip. Additionally, the chip has to be dimensionally small to enable the IC packages to be compact. It is therefore desirable for the interconnecting structures to be spaced apart while increasing the number of interconnection due to the increased logic function on the chip. The increased logic function on the chip means an increase in circuit density of the chip. As circuit density increases on the small-sized chip, it becomes important to provide a thin, reliable and robust packaging for forming the miniature packages. Also, the mechanical, electrical and heat dissipation properties of such miniature packages need to be carefully considered without affecting the overall performance of the IC.

Furthermore, a general concern for IC packaging of a semiconductor device is on the integrity of the IC package structure. The IC package structure typically comprises a substrate on which the semiconductor device is disposed. Typically, the substrate may be damaged due to, for example, cracks in the substrate when the substrate is subjected to stress. The substrate may be stressed during the coupling of the semiconductor device to the substrate or the handling of the IC package.

Additionally, after coupling the semiconductor device to the substrate, the structure of the IC package may also be weakened due to additional stress on the substrate and hence renders the IC package more susceptible to damages. Damages in the substrate adversely affect the integrity of the IC package structure, leading to insufficient support for the semiconductor device. It is therefore desirable to provide a solution to address at least one of the foregoing problems of the conventional operations.

SUMMARY OF THE INVENTION

It is therefore an object of the invention to provide a semiconductor package that includes a device carrier and a stiffener structure. The device carrier includes at least one insulating layer and at least conductive layer defining at least one trace layout unit. The stiffener structure is disposed on the device carrier, surrounding the periphery of the at least one trace layout unit. The stiffener structure is also disposed away from the periphery of the at least one trace layout unit, forming a cavity with the device carrier.

It is also an object of the invention to provide a manufacturing method of semiconductor package. The manufacturing method includes the steps of: providing a base layer; forming a patterned trace layout on the base layer; forming an insulating layer on the base layer and covering the patterned trace layout for forming a semiconductor substrate; forming a plurality of stiffener structures on the insulating layer to form a plurality of cavities with the insulating layer; and, breaking the semiconductor substrate along a plurality of spaced areas between the stiffener structures for forming a plurality of device carriers.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 2b shows different shapes of the locking elements of FIG. 2a;

DETAILED DESCRIPTION OF THE INVENTION

Figure 1A:
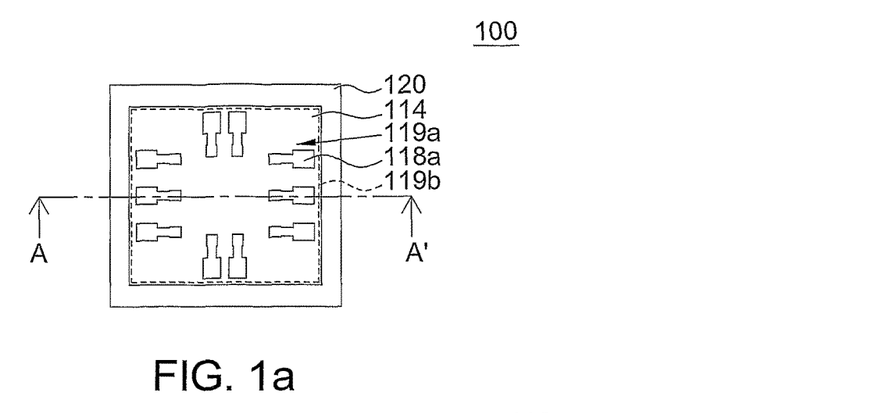
FIG. 1a shows a semiconductor package according to a preferred embodiment of the invention.
Figure 1B:
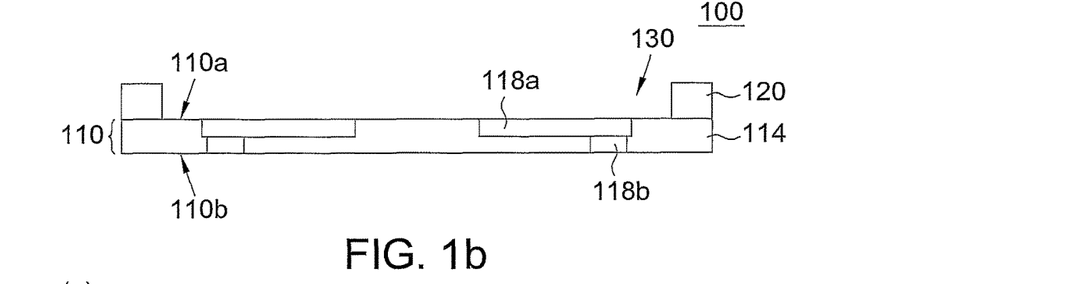
FIG. 1b shows a cross-sectional view of the semiconductor package of FIG. 1a along the line A-A'.

Referring to FIG. 1a and FIG. 1b, FIG. 1a shows a semiconductor package according to a preferred embodiment of the invention, FIG. 1b shows a cross-sectional view of the semiconductor package of FIG. 1a along the line A-A'. The semiconductor package 100 includes a device carrier 110 and a stiffener structure 120. The device carrier 110 includes at least one insulating layer 114 and at least conductive layer. The device carrier 110 is, for example, a molding substrate and has a first surface 110a and a second surface 110b. The material of the insulating layer 114 is a dielectric material or a molding compound.

The conductive layer has at least one trace layout unit 119a having a periphery 119b. The conductive layer includes a plurality of electro-isolated package traces 118a and a plurality of studs 118b. The location and number of the studs 118b are preferably in accordance with that of the package traces 118a. Preferably, the package traces 118a are embedded in the first surface 110a, and the studs 118b are embedded in the second surface 110b and electrically connected to the package traces 118a. At least one of the studs 118b is used for electrically connecting to other element or any peripheral device. The peripheral device is a printed circuit board (PCB), for example, which has a plurality of contact pads in the form of an array. The semiconductor package 100 can be assembled to the PCB by welding the studs 118b to connect to the contact pads.

As shown in FIG. 1a, the stiffener structure 120 is disposed on the first surface 110a and preferably formed during the manufacturing procedure of the device carrier as an integral part of the device carrier. Preferably, the stiffener structure 120 is formed from copper or steel. Alternatively, the stiffener structure 120 can have one or more than two laminated layers of the same or different materials. For example, the stiffener structure 120 has a first layer whose material is polymer, and has a second layer whose material is metal. As shown in FIG. 1a, the stiffener structure 120 is spaced away from the periphery 119b of the trace layout unit 119a and disposed along the periphery 119b for forming a ring-shaped structure. The stiffener structure 120 thus forms a cavity 130 with the device carrier 110. The stiffener structure 120 can be a continuous ring-shaped structure or a discontinuous ring-shaped structure having a plurality of disconnecting sections disposed along the periphery 119b of the trace layout unit 119a. The shape of the stiffener structure 120 can be rectangle, square, circle, etc, or irregular.

Figure 2A:
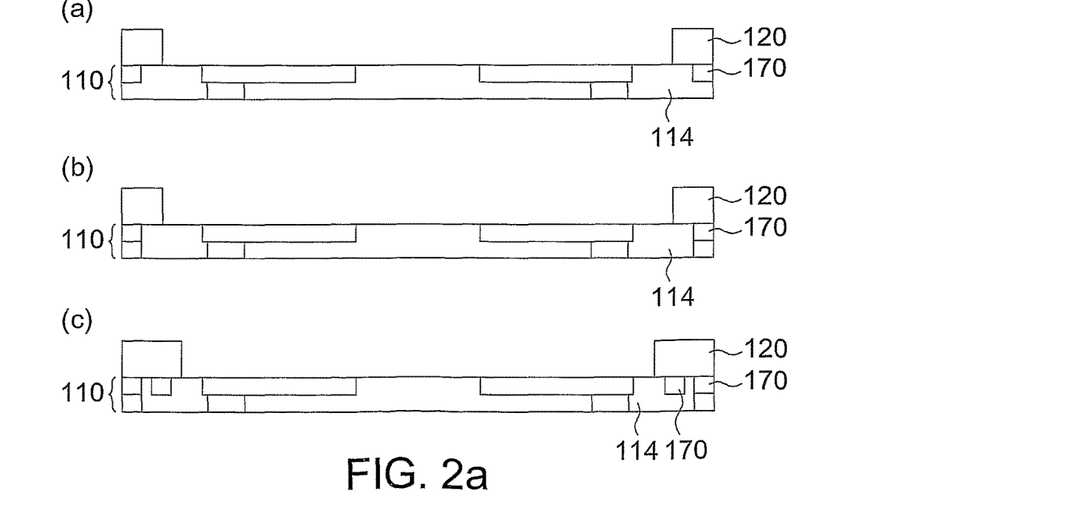
FIG. 2a shows the stiffener structure with locking features.
Figure 2B:
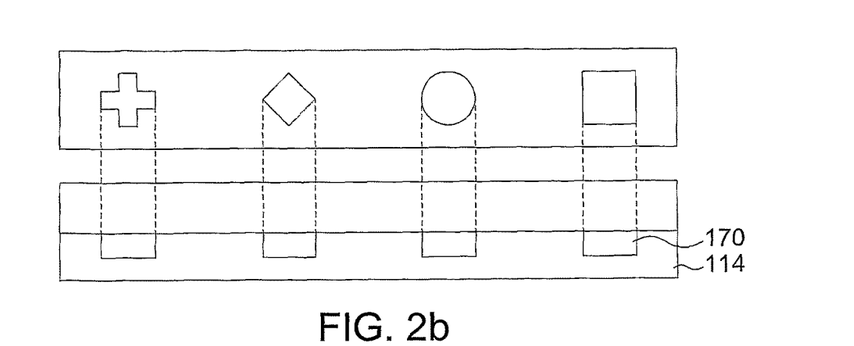

Referring to FIG. 2a and FIG. 2b, FIG. 2a shows the stiffener structure with locking features, FIG. 2b shows different shapes of the locking elements of FIG. 2a. As shown in FIG. 2a (a), at least one locking element 170 is embedded in the device carrier 110 and connected to the stiffener structure 120. The locking element 170 and the stiffener structure 120 can be formed into one piece in the manufacturing procedure. For example, the locking element 170 is formed on the stiffener structure 120 by electroplating the chosen material of the locking element 170 on the stiffener structure 120. The locking element 170 is used for fixing the stiffener structure 120 on the device carrier 110 and enhancing the strength and durability of the structure. As shown in FIG. 2a (b), the locking element 170 extends through the insulating layer 114 and is exposed from the insulating layer 114. Moreover, as shown FIG. 2a (c), two locking elements 170 of different heights are embedded in the insulating layer 114. The shape of the locking element 170 can be cross, diamond, circle or square, as shown in FIG. 2b.

Figure 3A:
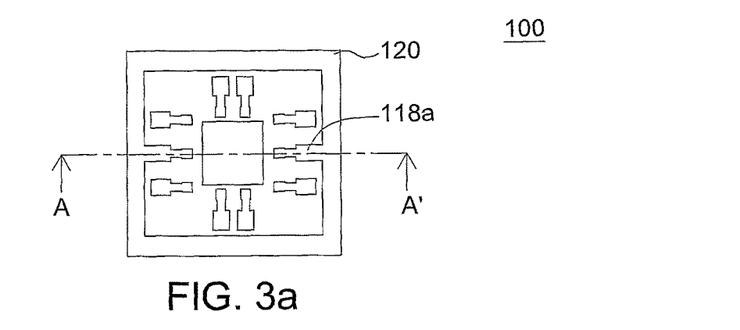
FIG. 3a shows the stiffener structure connecting to at least one package trace.
Figure 3B:
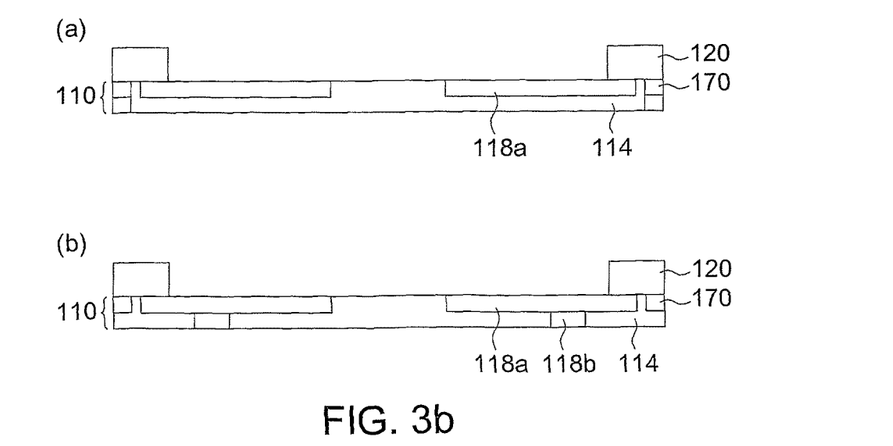
FIG. 3b shows cross-sectional views of the semiconductor package of FIG. 3a along the line B-B'.

As shown in FIG. 3a, the stiffener structure 120 (and the locking element 170) also connects to at least one package trace 118a. Preferably, as shown in FIG. 3b (a), the locking element 170 is connected to the package trace 118a by the stiffener structure 120, and extends to the bottom surface of the insulating layer 114 to connect to other element such as a peripheral device. A shown in FIG. 3b (b), the stiffener structure 120 directly connects to the package trace 118a, and is connected to other element by the stud 118b disposed under the package trace 118a.

Figure 4A:
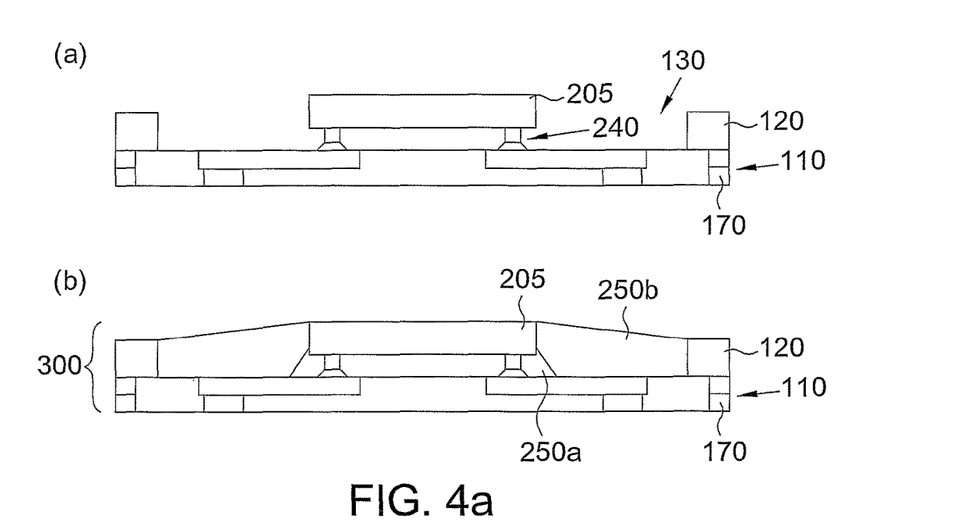
FIG. 4a shows a semiconductor assembly and a semiconductor package.

The device carrier 110 of the semiconductor package receives one or more semiconductor chips for forming a semiconductor assembly. As shown in FIG. 4a (a), the semiconductor assembly 200 includes a chip 205 such as an integrated circuit chip. The chip 205 is disposed in the cavity 130 of the device carrier 110.

The semiconductor assembly 200 further includes an interconnecting structure disposed in the cavity 130 for electrically connecting the chip 205 to the device carrier 110. Preferably, the transmission of signal between the studs 118b, which are electrically connected to other elements, and the chip 205 is achieved by the interconnecting structure 240.

The interconnecting structure 240 includes one or more electrical paths. Each of the electrical paths has at least one interconnecting layer. Preferably, the electrical path has two interconnecting layers, one interconnecting layer is preferably formed from a conductive material such as copper, and the other interconnecting layer is preferably formed from a solder material such as lead or tin. Examples of the electrical paths are pillar bumps and solder bumps.

Furthermore, as shown in FIG. 4a (b), the semiconductor assembly 200 is preferably combined with a filling structure for forming a semiconductor package 300. The filling structure used for filling the space within the semiconductor package 300 has at least a first filling material 250a and a second filling material 250b. The first filling material 250a fills the gap between the device carrier 110 and the chip 205. The second filling material 250b, which is positioned above the first filling material 250a, fills the gap between chip 205 and the stiffener structure 120. The materials of the first filling material 250a and the second filling material 250b can be the same or different, and are preferably insulating materials or dielectric materials.

The cavity 130 defined by the stiffener structure 120 facilitates the disposition of the filling structure, and easily controls the range and volume of the filling structure within the semiconductor package 300. Besides, the stiffener structure 120 and the filling structure thicken the structure of the device carrier 110, which reduces the possibility of flexure and crack on the device carrier 110 and provides additional support for the semiconductor package 300.

Figure 4B:
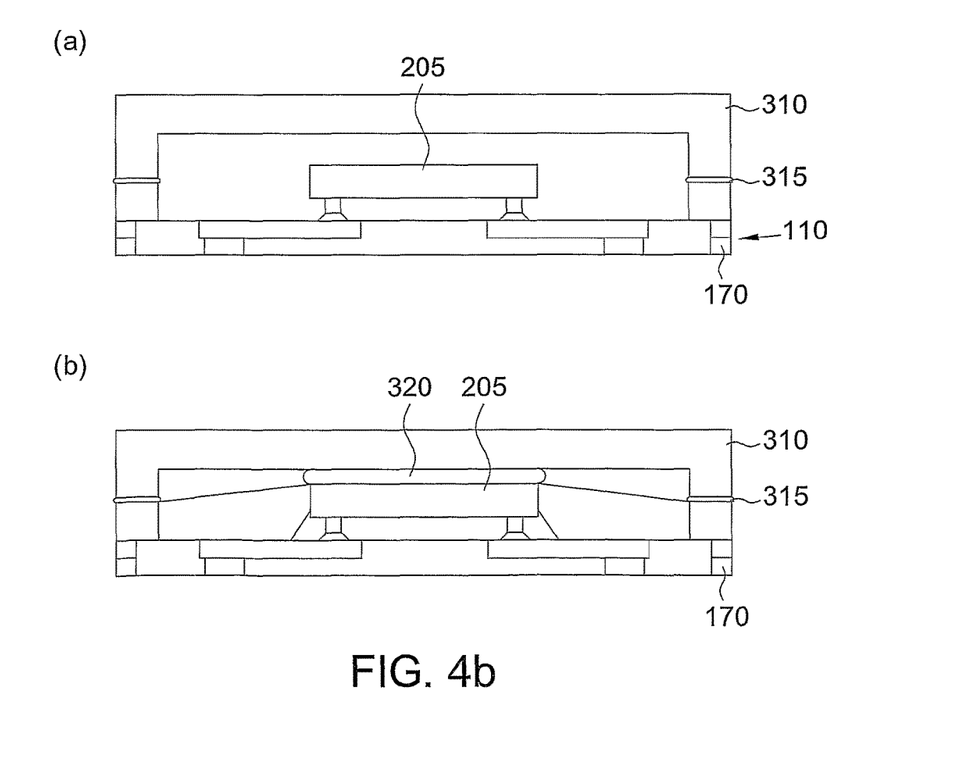
FIG. 4b shows the semiconductor assembly and the semiconductor package of FIG. 4a each further having a sealing cap.

The semiconductor package 300 further includes a sealing cap 310 disposed above the chip 205 and assembled to the stiffener structure 120 for encapsulating and protecting the chip 205 and the filling structure. The sealing cap 310 and the stiffener structure 120 are combined by an adhesive layer or a solder layer 315. The sealing cap 310 is preferably formed from metals and is used for applications such as electrostatic discharge protection, heat dissipation, and moisture proof. In the case of heat dissipation application, a heat conductive layer 320 is preferably disposed between the sealing cap 310 and the chip 205 to conduct the heat generated from the chip 205 to the external space.

Figure 5A:
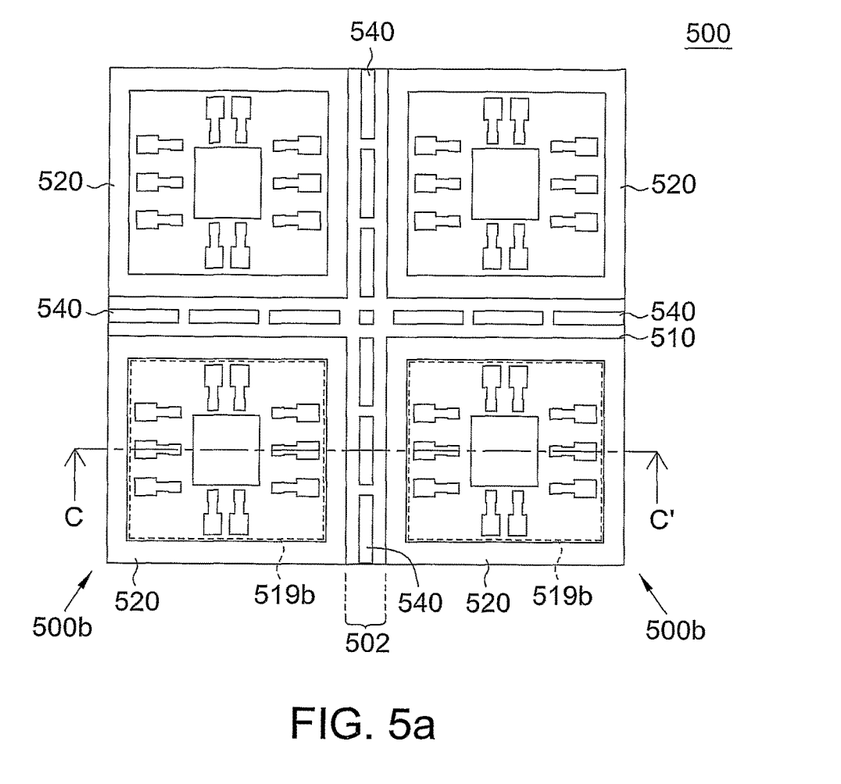
FIG. 5a shows a carrier array of the semiconductor package.
Figure 5B:
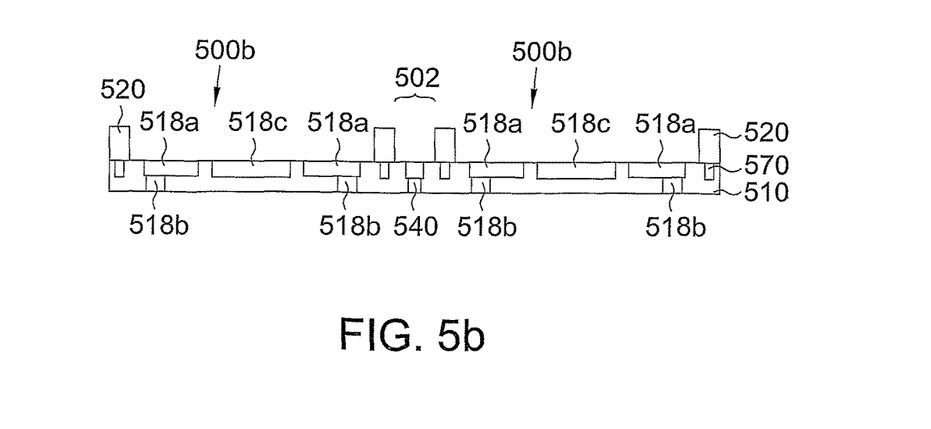
FIG. 5b and FIG. 5c show different cross-sectional views of the semiconductor package of FIG. 5a along the line C-C'.
Figure 5C:
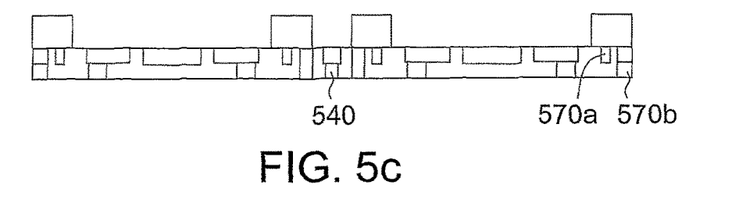

Referring to FIG. 5a, FIG. 5b and FIG. 5c, FIG. 5a shows a carrier array of the semiconductor package, FIG. 5b and FIG. 5c show different cross-sectional views of the semiconductor package of FIG. 5a along the line C-C'. The carrier array 500 includes a plurality of carrier units. Take the carrier units 500a and 500b for example. The device carrier 510 of the carrier units 500a and 500b has a plurality of electro-isolated package traces 518a, studs 518b and pads 518c, which form a plurality of trace layout units. The stiffener structures 520 are disposed along the peripheries 519b of the trace layout units and connected to the locking elements 570 for increasing the attachment to the device carrier 510.

Figure 6:
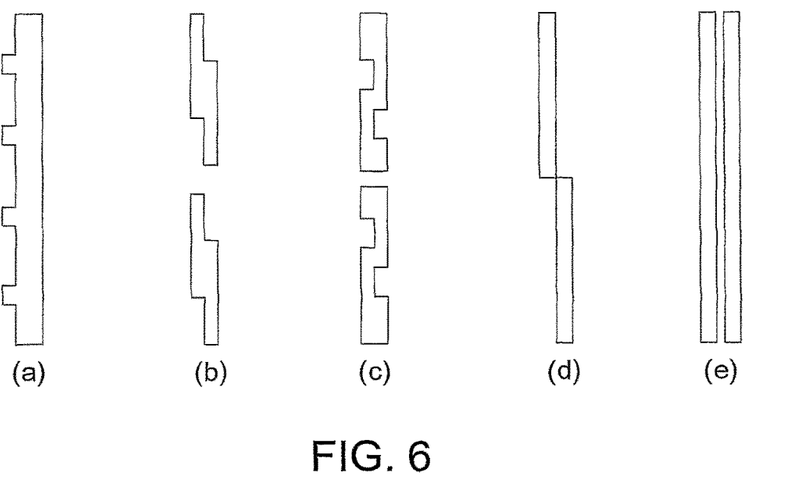
FIG. 6 shows the exemplary shapes of the locking elements and the guiding elements.

Preferably, as shown in FIG. 5b, a plurality of guiding elements 540 are disposed on the device carrier 510 in accordance with the spaced areas 502 between the carrier units 500a and 500b. Additionally, as shown in FIG. 5c, each stiffener structure 520 is connected to two locking elements 570a and 570b. The locking element 570b extends to the bottom surface of the device carrier 510 for assisting in dividing the device carrier 510 into the carrier units. Exemplary shapes of the locking elements 570*b* and the guiding elements 540 are disclosed in FIG. 6. The shape of the locking element 570*b* and the guiding elements 540 can be regular or irregular, such as sawteeth (a), disconnecting sections (b)-(d), or the guiding elements 540 can be disposed in parallel (e). The design of the locking element 570*b* and guiding elements 540 are used for increasing the interface adhesion of different materials within the device carrier 510 for process handling.

Figure 7:
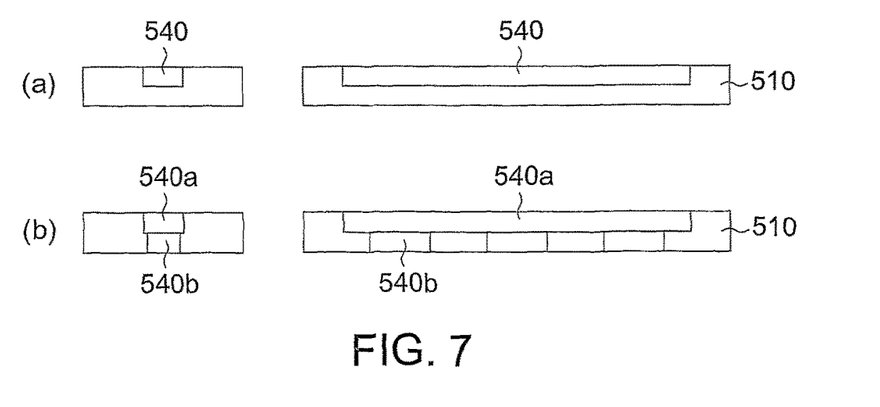
FIG. 7 shows different structures of the guiding elements.

FIG. 7 shows different structures of the guiding elements 540. The guiding elements 540 each have a single-layer structure (a), which is embedded in the device carrier 510 and its upper surface is exposed from the device carrier 510. The guiding elements can also have a multi-layer structure (b), which is at least consisted of a first guiding layer 540*a* and a second guiding layer 540*b*. The second guiding layer 540*b* is a discontinuous layer that connects to the first guiding layer 540*a* and extends to the bottom surface of the device carrier 510. Preferably, the width of the first guiding layer 540*a* is larger than the width of the second guiding layer 540*b*.

The guiding elements 540 are embedded in the device carrier 510 in the disclosure however the invention is not limited thereto. The guiding elements 540 can also be protruded from the upper surface of the device carrier 510 and partially embedded in the device carrier 510.

A manufacturing method of semiconductor package is disclosed. The manufacturing method includes the steps of: providing a base layer; forming a patterned trace layout on the base layer; forming an insulating layer on the base layer and covering the patterned trace layout for forming a semiconductor substrate; forming a plurality of stiffener structures on the insulating layer to form a plurality of cavities with the insulating layer; and, breaking the semiconductor substrate along a plurality of spaced areas between the stiffener structures for forming a plurality of device carriers. The carrier array 500 of FIG. 5*a* and FIG. 5*b* is taken for elaborating the detailed process of the manufacturing method but does not limit the scope of the invention.

Figure 8A:
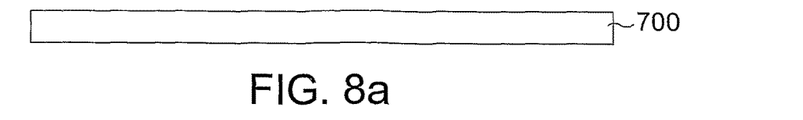
FIGS. 8a to 8h show the processes of the manufacturing method of semiconductor package.

FIGS. 8*a* to 8*h* show the processes of the manufacturing method of semiconductor package. As shown in FIG. 8*a*, a base layer 700 is provided. The base layer 700 is preferably a conductive structure whose material is metal such as copper or steel.

Figure 8B:
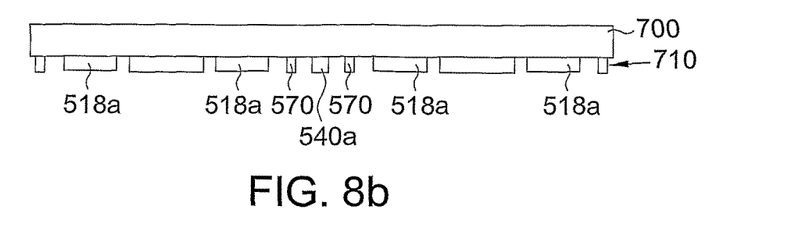

Next, a patterned trace layout is formed on the base layer 700. As shown in FIG. 8*b*, a first conductive layer 710 is formed on the base layer 700 by, for example, electroplating. The first conductive layer 710 includes the package traces 518*a*, the pads 518*c*, the locking elements 570 and the first guiding layers 540*a* of the guiding elements 540 (shown in FIG. 5*b*). The locking elements 570 are formed in accordance with the predetermined locations of the stiffener structures 520 (shown in FIG. 5*b*). The first guiding layers 540*a* are formed in accordance with the predetermined locations of the spaced areas 502 (shown in FIG. 5*b*) between the stiffener structures 520.

Figure 8C:
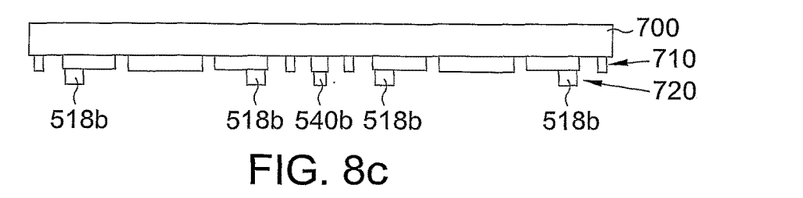

Then, as shown in FIG. 8*c*, a second conductive layer 720 is formed on the base layer 700 by electroplating, for example. The second conductive layer 720 includes the studs 518*b* and the second guiding layers 540*b* of the guiding elements 540 (shown in FIG. 5*b*). Herein the manufacturing process of the patterned trace layout is initially completed.

Figure 8D:
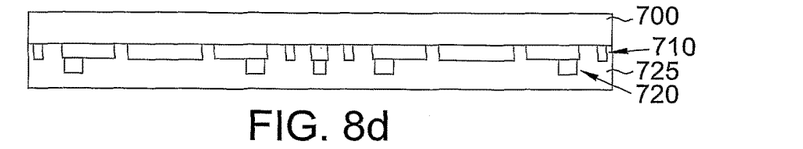
Figure 8E:
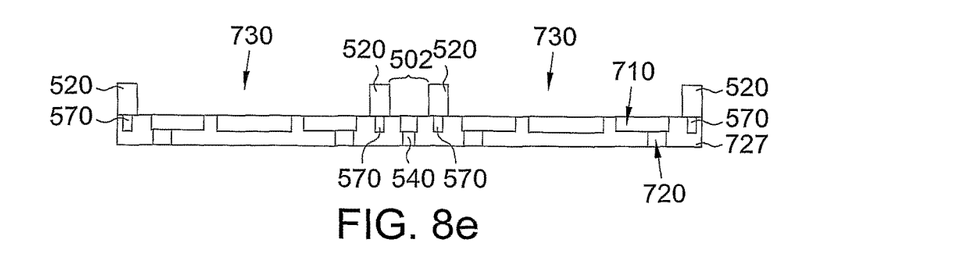

Next, an insulating layer is formed on the patterned trace layout for forming a semiconductor substrate of the carrier array. Preferably the insulating layer is formed using a molding material. Preferably, the molding material has a brittle nature. As shown in FIG. 8*d*, the molding material 725 is first disposed on the patterned trace layout (the first conductive layer 710 and the second conductive layer 720) and covers the patterned trace layout. After that, the molding material 725 is thinned by grinding to form an insulating layer 727, which is used as the semiconductor substrate of the device carrier 510 of FIG. 5*b*, that exposes the bottom surface of the second conductive layer 720, as shown in FIG. 8*e*.

Then, a plurality of stiffener structures are formed on the insulating layer 727. As shown in FIG. 8*e*, the base layer 700 is patterned for forming the stiffener structures 520, which are accordingly combined with the locking elements 570 and form a plurality of cavities 730 with the insulating layer 727. The base layer 700 is preferably patterned by the use of etchant and mask, which means, the base layer 700 is partially removed to form the stiffener structures 520. Alternatively, the base layer 700 is totally removed, and the stiffener structures 520 are additionally formed on the insulating layer 727. Herein the upper surface of the first conductive layer 710 is exposed out of the insulating layer 727.

If the stiffener structures 520 each have a multi-layer structure, one layer of the stiffener structures 520 can be formed by patterning the base layer 700, and another layer of the stiffener structures 520 can be additionally formed in accordance with the previous layer.

Figure 8F:
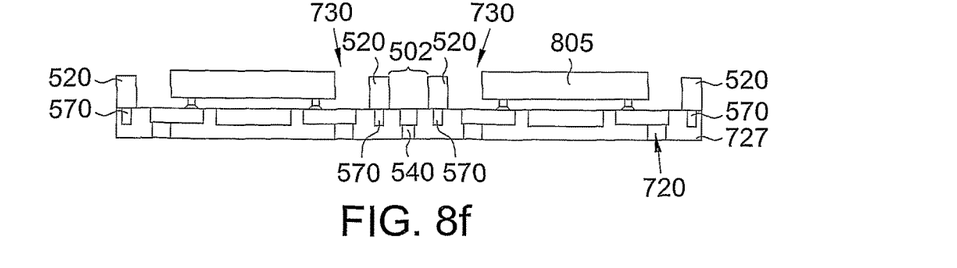

The manufacture of the carrier array 500 is hence finished. Before the step of separating the carrier array 500 to form a plurality of carrier units (such as the carrier units 500*a* and 500*b* of FIG. 5*b*), the manufacture of semiconductor packages can be proceeded in advance. As shown in FIG. 8*f*, a plurality of chips 805 are disposed in the cavities 730 and electrically connected to the pads 518*c* and/or the package traces 518*a* of the first conductive layer 710 of the patterned trace layout.

Figure 8G:
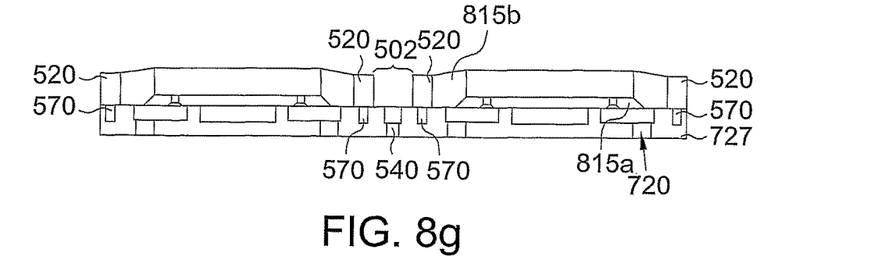

A filling structure is then disposed in the cavities 730. In this step, as shown in FIG. 8*g*, a first filling material 815*a* is provided to fill the gaps between the semiconductor substrate and the chips 805, and a second filling material 815*b* is provided to fill the gaps between the chips 805 and the stiffener structures 520. Afterwards, a plurality of sealing caps (such as the sealing cap 310 of FIG. 3*b*) can be provided to be disposed above the cavities 730 and assembled to the stiffener structures 520, so as to encapsulate and protect the chips 805 as well as the filling structures.

Figure 8H:
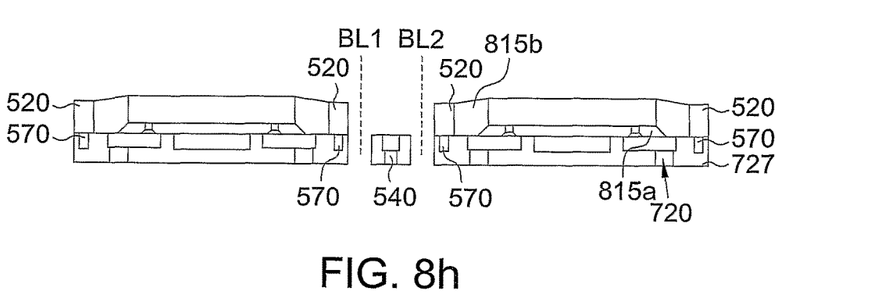

When forming individual carrier unit, the carrier array 500 of FIG. 5*a* is separated along the spaced areas 502 between the stiffener structures 520. Due to the fragile interface of the insulating layer 727 between the guiding elements 540 and the stiffener structures 520, the semiconductor substrate is easily separated along the breaking lines BL1 and BL2 by proper manufacturing process, thus producing the carrier units 500*a* and 500*b* as shown in FIG. 8*h*.

Figure 9:
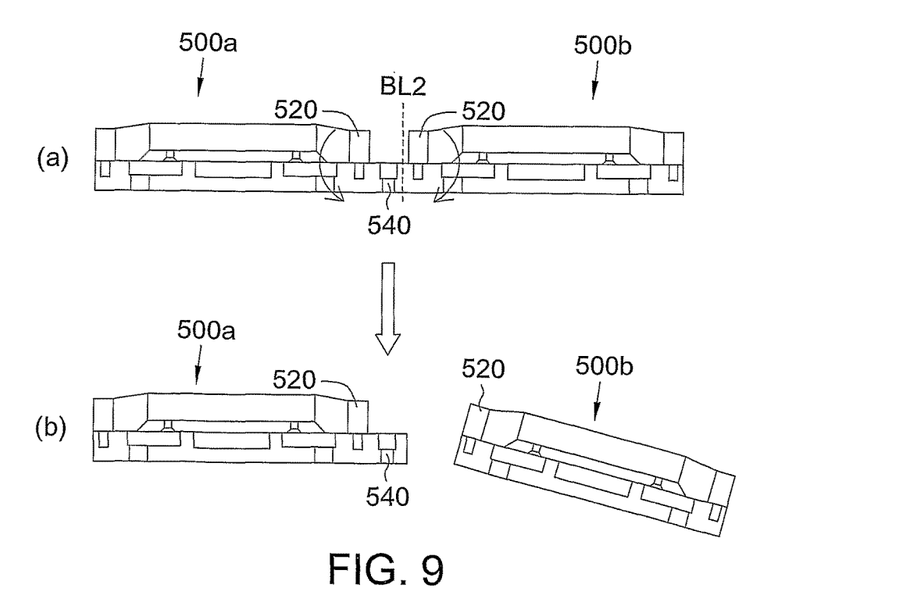
FIGS. 9 and 10 show different manufacturing processes for dividing the carrier array.
Figure 10:
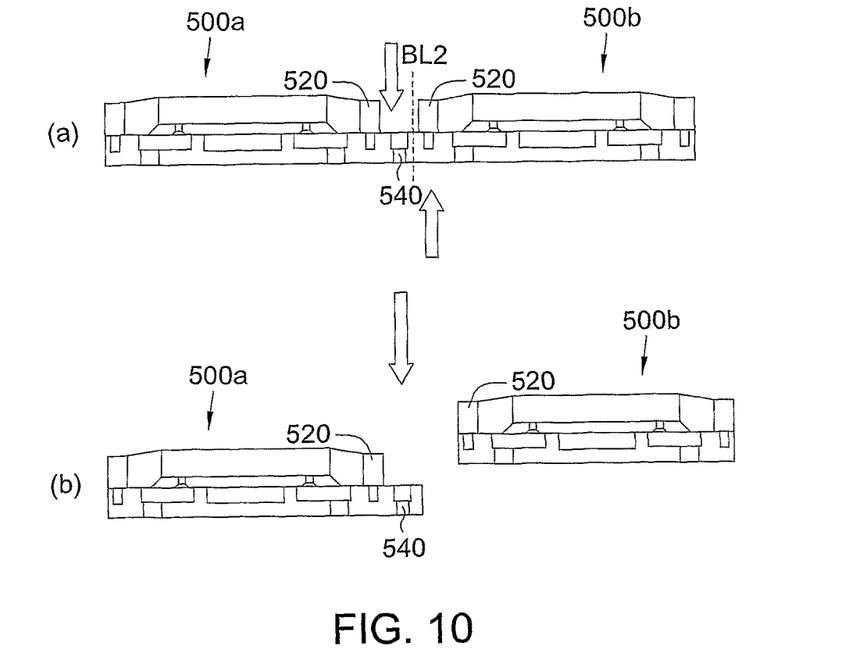

FIGS. 9 and 10 show different manufacturing processes for dividing the carrier array. As shown in FIG. 9, the carrier unit 500*b* and its stiffener structure 520, and the guiding element 540 are first fixed and positioned. Then, applying force to the carrier unit 500*b* and its stiffener structure 520 for generating a bending mechanism on the semiconductor substrate, so as to separate the carrier unit 500*b*. Alternatively, as shown in FIG. 10, a shear mechanism is generated on the semiconductor substrate, such that the carrier unit 500*b* is separated. By repeating the above process, all the carrier units of the carrier array 500 can be divided. And the manufacture of a plurality of individual semiconductor packages is completed.

According to the semiconductor package and the manufacturing method thereof disclosed in the embodiment of the invention, the stiffener structure is disposed on the device carrier for predetermining the location of the filling structure and controlling the volume of the filling structure in the subsequent process. Besides, the stiffener structure and the filling structure located between the chip and the device carrier provide additional support for the chip and the semiconductor package, enhancing the structural strength of the semiconductor package and impeding the flexure to the package, which largely increases the yield of the manufacturing process. Furthermore, when manufacturing the semiconductor package, the semiconductor substrate is separated via the bending or shear mechanism along predetermined spaced areas in which the guiding elements are located. Therefore, individual device carrier is produced without the use of blade, which is quite different from the conventional manufacturing method accompanied by the problem of worn blade.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
a device carrier having a first surface and a second surface opposite to the first surface, wherein the device carrier comprises:
a trace layout unit having a periphery and electrically connecting the first surface of the device carrier to the second surface of the device carrier, wherein a semiconductor device is disposed on the device carrier within the periphery and connected to the trace layout unit;
a plurality of locking elements disposed along the periphery of the trace layout unit and spaced away from the trace layout unit, wherein the trace layout unit and the plurality of locking elements are embedded in an insulating layer of the device carrier, and the plurality of locking elements is a part of the device carrier and entirely sealed by and directly connected with the insulating layer; and
a stiffener structure disposed on the device carrier along the periphery of the trace layout unit and comprises a cavity enclosing the semiconductor device therein, wherein the stiffener structure corresponds to the locking elements, each of the plurality of locking elements connects to and extends from the stiffener structure into the insulating layer, and the plurality of locking elements is distributed along a substantial length of the stiffener structure surrounding the trace layout unit.

2. The semiconductor package according to claim 1, further comprising:
a filling structure disposed within the cavity, between the semiconductor device and the device carrier, and between the semiconductor device and the stiffener structure.

3. The semiconductor package according to claim 2, wherein the filling structure comprises a first filling material and a second filling material, the first filling material is disposed between the device carrier and the semiconductor device, the second filling material is disposed between the semiconductor device and the stiffener structure.

4. The semiconductor package according to claim 1, further comprising:
a sealing cap disposed on the stiffener structure, wherein the stiffener structure and the sealing cap seal the semiconductor device and the trace layout unit on the device carrier.

5. The semiconductor package according to claim 1, wherein the locking elements extend through the device carrier and are exposed on the second surface of the device carrier.

6. The semiconductor package according to claim 1, wherein the trace layout unit comprises a plurality of traces exposed and embedded in the first surface of the device carrier and a plurality of studs exposed and embedded in the second surface of the device carrier, the plurality of traces are electrically connected to the plurality of studs.

7. The semiconductor package according to claim 1, wherein the trace layout unit comprises:
at least one first conductive layer comprising a plurality of traces; and
at least one second conductive layer comprising a plurality of studs, wherein the plurality of studs are disposed correspondingly on the plurality of traces;
wherein the plurality of traces and studs are embedded in the insulating layer between the first and second surface of the device carrier.

8. The semiconductor package according to claim 1, wherein the stiffener structure is disposed on part of the trace layout unit on the device carrier and the trace layout unit is electrically connected to the stiffener structure and the locking elements.

9. The semiconductor package according to claim 4, wherein a polymeric or solderable material layer is disposed between the stiffener structure and the sealing cap.

10. The semiconductor package according to claim 1, wherein the stiffener structure and the locking elements comprise at least one conductive material and the stiffener structure is electrically connected to the locking elements.

11. The semiconductor package according to claim 10, further comprising:
a polymeric material layer disposed between the device carrier and the stiffener structure, wherein the stiffener structure is electrically isolated from the locking elements.

12. The semiconductor package according to claim 1, wherein the stiffener structure is a continuous structure disposed along the periphery of the trace layout unit.

13. The semiconductor package according to claim 1, wherein the stiffener structure is a discontinuous structure having a plurality of sections disposed along the periphery of the trace layout unit.

14. The semiconductor package according to claim 1, wherein the periphery of the trace layout unit lies within the edges of the device carrier.

15. A method manufacturing a of semiconductor package, comprising:
providing a base layer;
forming a trace layout unit and a plurality of locking elements simultaneously by electroplating on the base layer, wherein the trace layout unit having a periphery, the plurality of locking elements is along the periphery of the trace layout unit and spaced away from the trace layout unit;

forming an insulating layer on the base layer, wherein the insulating layer seals and directly connects with the trace layout unit and the plurality of locking elements; and removing part of the base layer to form a cavity and expose the trace layout unit within the cavity wherein the remaining part of the base layer forms a stiffener structure along the periphery of the trace layout unit, each of the plurality of locking elements connects to and extends from the stiffener structure into the insulating layer, and the plurality of locking elements is distributed along a substantial length of the stiffener structure surrounding the trace layout unit.

16. The manufacturing method according to claim 15, further comprising:

disposing a semiconductor device within the cavity, wherein the semiconductor device is connected to the trace layout unit; and forming a filling structure within the cavity, wherein the filling structure fills between the semiconductor device and the insulating layer, and between the semiconductor device and the stiffener structure.

17. The manufacturing method according to claim 16, wherein the step of forming the filling structure comprises:

disposing a first filling material between the semiconductor device and the insulating layer; and disposing a second filling material between the semiconductor device and the stiffener structure.

18. The manufacturing method according to claim 15, further comprising:

disposing a sealing cap on the stiffener structure, wherein the stiffener structure and the sealing cap seal the semiconductor device with the trace layout unit.

19. The manufacturing method according to claim 15, wherein the step of forming the trace layout unit comprises:

forming at least one first conductive layer comprising a plurality of traces; and forming at least one second conductive layer comprising a plurality of studs on the first conductive layer, wherein the plurality of studs are disposed correspondingly on the plurality of traces.

20. The manufacturing method according to claim 15, wherein the plurality of locking elements is formed simultaneously with the trace layout unit on the base layer.

21. The manufacturing method according to claim 15, wherein the base layer is completely removed and the plurality of locking elements is exposed on the first surface of the device carrier along the periphery of the trace layout unit.

22. The manufacturing method according to claim 18, wherein prior to the step of disposing the sealing cap, the manufacturing method further comprises:

disposing a polymeric or solderable material on the stiffener structure and assembling the sealing cap to the polymeric or solderable material.

23. The manufacturing method according to claim 15, wherein the step of forming the insulating layer comprises:

disposing a dielectric molding compound on the base layer to encapsulate the trace layout unit and the plurality of locking elements completely; and thinning the dielectric molding compound to expose the trace layout unit from the surface of the insulating layer.

24. The semiconductor package according to claim 1, wherein the periphery of the trace layout unit corresponds to the edges of the device carrier, and the stiffener structure and the locking elements are disposed along the edges of the device carrier.

25. The semiconductor package according to claim 1, wherein the locking elements are completely covered by the stiffener structure on the surface of the device carrier.

26. The semiconductor package according to claim 1, wherein the periphery of the trace layout unit corresponds to the edges of the device carrier, and the locking elements is disposed along the edges of the device carrier.

27. The semiconductor package according to claim 26, wherein the locking elements are exposed on the sidewalls of the device carrier.

28. The semiconductor package according to claim 1, wherein the locking elements are an array of columnar features extending from the first surface into the device carrier.

29. The semiconductor package according to claim 1, wherein the locking elements are sections of extended lengths in parallel to the periphery of the trace layout unit.

* * * * *